(12) United States Patent
Kudoh

(10) Patent No.: US 6,823,784 B2
(45) Date of Patent: Nov. 30, 2004

(54) SCREEN PRINTING METHOD INCLUDING DEGASSING BUBBLES IN THE COATING MATERIAL

(75) Inventor: Tsukasa Kudoh, Tokyo (JP)

(73) Assignee: New Long Seimitsu Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/272,985

(22) Filed: Oct. 18, 2002

(65) Prior Publication Data

US 2003/0188645 A1 Oct. 9, 2003

(30) Foreign Application Priority Data

Apr. 9, 2002 (JP) ........................ 2002-106136

(51) Int. Cl.⁷ .............................. B41M 1/12; B41F 15/08
(52) U.S. Cl. ........................ 101/129; 101/123; 101/126; 427/282
(58) Field of Search .................... 427/282, 96; 101/114, 101/123, 124, 126, 129

(56) References Cited

U.S. PATENT DOCUMENTS 4,939,991 A * 7/1990 Szarka ........................ 101/115
5,022,320 A * 6/1991 Szarka ........................ 101/123
5,713,277 A * 2/1998 Szarka ........................ 101/123
6,073,554 A * 6/2000 Cutcher, Sr. ................. 101/127
6,240,840 B1 * 6/2001 Murakami ................... 101/114

FOREIGN PATENT DOCUMENTS

JP 10-313015 11/1998
JP 2000-216526 8/2000

* cited by examiner

Primary Examiner—Leslie J. Evanisko
(74) Attorney, Agent, or Firm—Wenderoth, Lind & Ponack L.L.P.

(57) ABSTRACT

A screen printing method is carried out by placing a material to be printed at a predetermined portion of a printing table, feeding a paste-state or ink-state coating material to a surface of a screen plate for printing, and sliding the surface of the screen plate relative to a squeegee to carry out screen printing. The above-mentioned paste-state or ink-state coating material is covered on the surface of the screen plate for printing with a thin thickness, and the paste-state or ink-state coating material coated on the surface of the screen plate for printing is printed to a material to be printed by the above-mentioned squeegee under vacuum or atmospheric pressure. After the above-mentioned coating step, a degassing step is provided to degas bubbles in the coated material by changing the pressure from high vaccum state to atmospheric pressure or low vacuum state.

16 Claims, 5 Drawing Sheets

SCREEN PRINTING METHOD INCLUDING DEGASSING BUBBLES IN THE COATING MATERIAL

BACKGROUND OF THE INVENTION

1. Field of the Invention

The present invention relates to a screen printing method, and more specifically to a screen printing method in which screen printing is carried out by placing a material to be printed on a printing table at a predetermined portion, feeding a coating material in a paste state or an ink state onto the surface of a screen plate for printing, and sliding a squeegee on the surface of the screen plate.

2. Prior Art

In screen printing, a desired printing has been carried out on a printing surface of a material to be printed by placing the material to be printed on a predetermined portion of a printing table, and feeding a paste-state or ink-state coating material comprising an insulating material or a dielectric material onto the surface of a screen plate for printing using a squeegee or a squeegee and a scraper.

The conventional screen printing method has been usually carried out under atmospheric pressure. Screen printing using a stencil made of a metal, and screen printing using a screen plate made of a gauze-adhered plate are known. In the former screen printing using a stencil made of a metal, the stencil is contacted to a printing surface of a material to be printed, and printing is carried out by pouring the paste-state or ink-state coating material into pore portions of the stencil. Thus, printing is carried out by a squeegee without coating by using a scraper.

Also, in the latter screen printing using a screen plate comprising a gauze-adhered plate, printing is carried out by providing a clearance between the screen plate and a printing surface of a material to be printed, coating a paste-state or ink-state coating material on the surface of the screen plate by a scraper, and then printing the paste-state or ink-state coating material coated on the surface of the screen plate to a material to be printed by a squeegee.

Also, in the screen printing by a stencil using a stencil made of a metal, bubbles are accumulated at the bottom portion of the pore portions of the stencil, so that resin encapsulation of electronic parts cannot be carried out when the electronic parts are required to have high quality and high performances. Thus, for example, in Japanese Laid-Open Patent Application No. 2000-216526, it is disclosed that the above problem can be prevented by performing the resin encapsulation under vacuum atmosphere. Also, in Japanese Laid-Open Patent Application No. Hei 10-313015, it is disclosed to separately carry out feeding of a resinous solution under atmospheric pressure conditions and stencil printing under vacuum atmosphere.

However, in the conventional screen printing method, the ink in an ink fountain is thick and thus bubbles are difficult to remove. Moreover, rolling is carried out by pushing the ink fountain portion, so that ink containing bubbles is transferred. Also, in the screen printing method using a stencil under vacuum atmosphere, bubbles are removed from the surface of the resin encapsulated portion provided by printing when it is returned to atmospheric pressure from vacuum atmosphere, so that unevenness occurs on the surface of the printed surface by the popped bubbles. The positions or sizes of the popped bubbles cannot be expected and controlled so that there is a fear of causing significant gaps in an amount or thickness of the paste-state or ink-state coating material to be printed.

Also, when a stencil contacts the printing surface of a material to be printed and printing is carried out such that a paste-state or ink-state coating material flows into a pore portion of the stencil, a stencil and a material to be printed are incompletely adhered. Thus, a coating material migrates from the pore portion of the stencil to the back surface side thereof so that there is a possibility of adhering a coating material to an unintentional portion of the surface of the material to be coated.

Moreover, in a screen printing method using a screen plate comprising a gauze adhered plate, when printing is carried out on a material to be printed by coating a paste-state or ink-state coating material on the surface of the screen plate by a scraper, and then a paste fountain or ink fountain stand is applied at one end side of the surface of the screen plate by a squeegee, excessive coating material is printed to the material to be printed by the screen plate. Thus, there is a fear of attaching the coating material to a portion of the material to be printed other than that portion desired to be printed, or oozing occurring.

SUMMARY OF THE INVENTION

An object of the present invention is to provide a screen printing method which can degas a paste-ink or ink-state coating material before printing, can prevent unevenness of the surface of a printed surface due to bubbles popped from the surface of a printed resin encapsulated portion, can carry out screen printing of high-quality and high-performance electronic parts by providing an amount or thickness of a paste-state or ink-state coating material to be printed, can avoid attaching a coating material to an unintentional portion of the surface of a material to be printed, and can avoid printing excessive printing material to the material to be printed from a screen plate, attaching a coating material to a portion other than a desired portion of the material to be printed, or causing oozing.

To accomplish the above-mentioned objects, a screen printing method of the first embodiment of the present invention comprises placing a material to be printed at a predetermined portion of a printing table, feeding a paste-state or ink-state coating material to a surface of a screen plate for printing, and sliding the surface of the screen plate relative to the surface of a squeegee to carry out screen printing.

The above-mentioned paste-state or ink-state coating material is covered on the surface of the screen plate for printing with a thin thickness, and the paste-state or ink-state coating material coated on the surface of the screen plate for printing is printed to a material to be printed by the above-mentioned squeegee under vacuum or atmospheric pressure. After the above-mentioned coating step, a degassing step is performed to degas bubbles in the coated material by changing the pressure from a high vacuum state to atmospheric pressure or a low vacuum state.

Also, the screen printing method of the second embodiment of the present invention comprises placing a material to be printed at a predetermined portion of a printing table, feeding a paste-state or ink-state coating material to a surface of a screen plate for printing, and sliding the surface of the screen plate relative to the surface of a squeegee to carry out screen printing.

The above-mentioned paste-state or ink-state coating material is covered on the surface of the screen plate for printing with a thin thickness, and the paste-state or ink-state coating material coated on the surface of the screen plate for printing, which is obtained from an ink fountain at a side of one edge of the surface of the screen plate, is printed by the above-mentioned squeegee in vacuum or atmospheric pressure.

Also, the screen printing method of the third embodiment of the present invention comprises placing a material to be printed at a predetermined portion of a printing table, feeding a paste-state or ink-state coating material to a surface of a screen plate for printing, and sliding the surface of the screen plate relative to the surface of a squeegee to carry out screen printing.

The above-mentioned paste-state or ink-state coating material is covered on the surface of the screen plate for printing with a thin thickness, and the paste-state or ink-state coating material coated on the surface of the screen plate for printing, which is obtained from an ink fountain at a side of one edge of the surface of the screen plate, is printed by the above-mentioned squeegee in a vacuum or atmospheric pressure. After the above-mentioned coating step, a degassing step is performed to degas bubbles in the coated material by changing the pressure from a high vacuum state to atmospheric pressure or a low vacuum state.

Also, the screen printing method of the fourth embodiment of the present invention comprises placing a material to be printed at a predetermined portion of a printing table, feeding a paste-state or ink-state coating material to a surface of a screen plate for printing, and sliding the surface of the screen plate relative to the surface of a squeegee to carry out screen printing.

The above-mentioned paste-state or ink-state coating material is covered on the surface of the screen plate for printing with a thin thickness, and the paste-state or ink-state coating material coated on the surface of the screen plate for printing, which is obtained from an ink fountain at a side of one edge of the surface of the screen plate in the coating step, is printed by the above-mentioned squeegee in a vacuum or atmospheric pressure. After completion of the above-mentioned coating step and before the printing step, a degassing step is performed to degas bubbles in the coated material by changing the pressure from a high vacuum state to atmospheric pressure or a low vacuum state, and the printing step is carried out in a vacuum atmosphere.

Also, the screen printing method of the fifth embodiment of the present invention comprises covering a paste-state or ink-state coating material on the surface of a screen plate for printing with a thin thickness by a scraper a plural number of times. A height of the scraper at the latter coating is made the same or different as the height of the scraper at the former coating.

Also, in the screen printing method of the sixth embodiment of the present invention, the above-mentioned screen plate for printing is a gauze-adhered plate or stencil.

BRIEF DESCRIPTION OF THE DRAWINGS

FIGS. 1A-1C are drawings showing that the screen printing method of the present invention is applied to a single coat screen printing method, wherein FIG. 1A is a front sectional view showing a coating step, FIG. 1B is a front sectional view showing a degassing step, and FIG. 1C is a front sectional view showing a printing step in which the reference numeral 11 is a screen printing apparatus, 12 is a platen on which a material to be printed is mounted, 13 is a material to be printed, 14 is a plate frame, 15 is a squeegee, 17 is a scraper, 19 is a screen plate, 19a is the first end, 19b is the second end of the screen plate, 21 is ink, 22 is an ink fountain, 23 is a vacuum chamber and 25 is a lid.

FIGS. 2A and 2B are drawings showing a step of printing in which a second sheet of the material to be printed is printed according to the screen printing method of the present invention, wherein FIG. 2A is a front sectional view showing the state of returning a squeegee and a scraper, and FIG. 2B is a front sectional view showing a coating state in a coating step.

FIGS. 3A and 3B are drawings showing a step of printing in which a second sheet of the material to be printed is printed according to the screen printing method of the present invention, wherein FIG. 3A is a front sectional view showing a degassing step, and FIG. 3B is a front sectional view showing a printing step.

FIGS. 4A-4C are drawings showing that the screen printing method according to the present invention is applied to a screen printing method of double coating, wherein FIG. 4A is a front sectional view showing a second coating state as a coating step, FIG. 4B is a front sectional view showing a degassing step, and FIG. 4C is a front sectional view showing a printing step.

DETAILED DESCRIPTION OF THE PREFERRED EMBODIMENTS

Figure 1A:
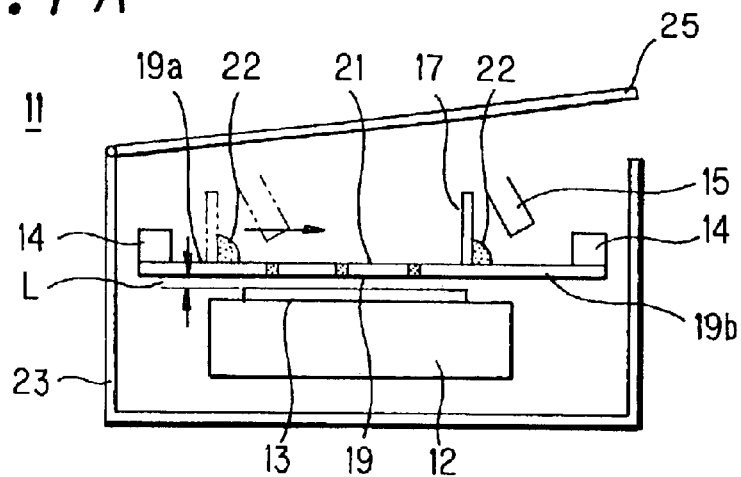

In the following, the screen printing method according to the present invention is explained in detail by referring to the drawings.

FIGS. 1A, 1B, 1C to FIG. 5 each show the screen printing method according to the present invention. In this embodiment, the present invention is explained by a screen printing method using a screen plate comprising a gauze-adhered plate. This embodiment can be similarly applied to a screen printing by using a stencil such as metal and the like. In FIGS. 1A, 1B, 1C, FIGS. 2A, 2B, and FIGS. 3A and 3B, a single coat screen printing method is shown. A screen printing apparatus 11 has a squeegee 15 for printing provided at above a material to be printed 13 such as a substrate mounted on a platen 12 on which a material to be printed is mounted, and has a scraper 17 for squeezing ink. At a position above the material to be printed 13 such as a substrate, a screen plate 19 comprising a gauze adhered plate attached to a plate frame 14 is provided.

Onto the surface of the above-mentioned screen plate 19, ink 21 in the form of a paste-state or ink-state coating material is fed, and the above-mentioned squeegee 15 and the scraper 17 are driven in a front and rear direction or a right and left direction by a driving mechanism which is not shown in the drawing. In this embodiment of the present invention, screen printing on the surface of the material to be printed 13 is carried out by sliding the surface of the screen plate 19 in the right and left direction with respect to the above-mentioned squeegee 15 and the scraper 17.

The above-mentioned screen printing apparatus 11 is contained in a vacuum chamber 23, and a vacuum pump or valve which is not shown in the figure is connected to the vacuum chamber. The vacuum chamber is set to a low vacuum or a high vacuum (as compared to atmospheric pressure) by opening or closing a lid 25 provided on the vacuum chamber 23.

An appropriate clearance L is provided between the screen plate 19 and the surface of the material to be printed 13. At one end 19a of the screen plate 19, ink 21 in a paste-state or ink-state coating material is supplied from an ink feeding mechanism, and the ink 21 from the ink feeding mechanism forms an ink fountain 22.

In FIG. 1A, a coating step is shown in which the ink 21 at the ink fountain 22 is coated from the first end 19a side of the screen plate 19 to the second end 19b side by a scraper 17 under atmospheric pressure. This coating is off-contact coating.

Figure 1B:
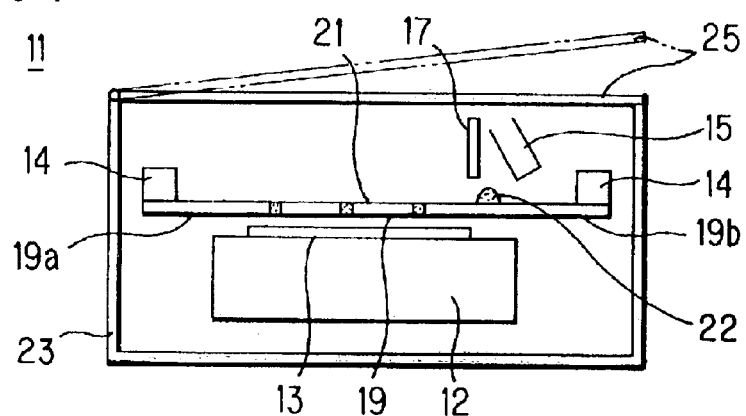

As shown in FIG. 1B, after completion of this coating step, a vacuum pump and the like provided at a vacuum chamber 23 is operated, and a lid 25 is opened and closed to change the pressure from a highly vacuum state to an atmospheric pressure or a lower vacuum state whereby a degassing step is carried out to degas bubbles in the ink 21 which is a coating material. In the drawing, vacuum state and atmospheric pressure are schematically shown by opening and closing a lid 25, and the invention is not limited to only opening and closing the lid 25, but may be opening and closing of a valve. The above-mentioned high vacuum state is about 0.067 KPa, the low vacuum state is about 90 KPa, and the atmospheric pressure is about 101.3 KPa.

This degassing step of the ink 21 filed at the printed portion of the screen plate 19 and the ink 21 portion spread over with a thin thickness is carried out by generating a higher vacuum state than the atmospheric pressure. Then the higher vacuum state is changed to the atmospheric pressure or a lower vacuum state to progress occurrence and expansion of bubbles under the higher vacuum state. Thereafter, the chamber 23 is set to atmospheric pressure or a lower vacuum pressure. The degassing treatment under the atmospheric pressure or lower vacuum pressure than the higher vacuum pressure can be carried out repeatedly a plural number of times. Incidentally, a time period of the higher vacuum state and the atmospheric pressure state or the lower vacuum state can be optionally set depending on a size of the screen printing apparatus 11 or the type of ink 21.

Figure 1C:
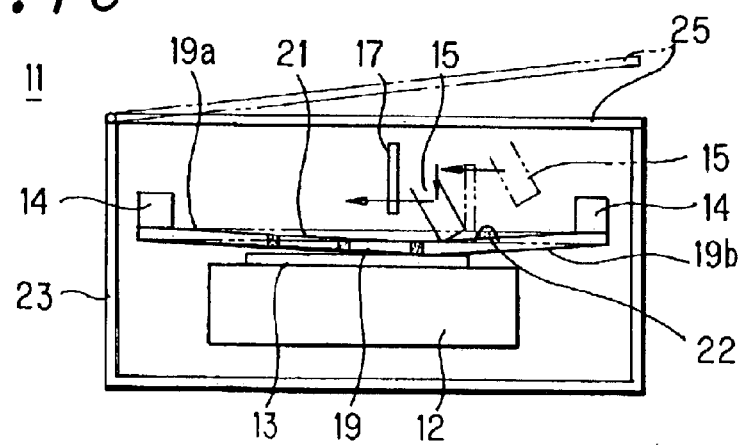

As shown in FIG. 1C, after the degassing step, a printing step is carried out. This printing step is carried out by printing ink 21, which is a paste-state or ink-state coating material coated on the surface of the screen plate 19 for printing (obtained from an ink fountain 22 at the second end 19b of the surface of the screen plate 19) is printed by pressing the above-mentioned squeegee 15 to a material to be printed 13.

This printing step is carried out in a high-vacuum state. Also, the squeegee 15 is moved in a reverse direction with respect to that of the coating step. In this step, ink is transferred to the material to be printed 13 with only the ink 21 being coated with a thin thickness on the screen plate 19 from an ink fountain 22, and the ink is filled in the screen plate 19 so that clear printing can be done without any oozing.

Incidentally, the step of printing, in which the screen plate 19 for printing arranged the ink fountain 22 is printed by the squeegee 15, may be applied to contact printing using a metal plate.

Figure 2A:
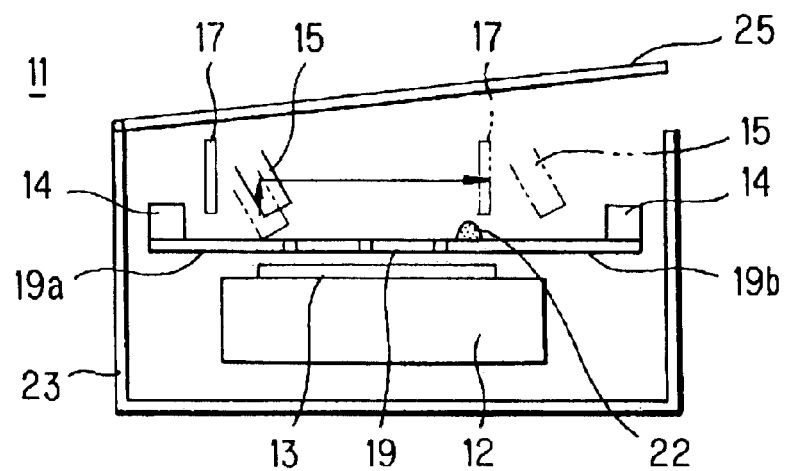
Figure 2B:
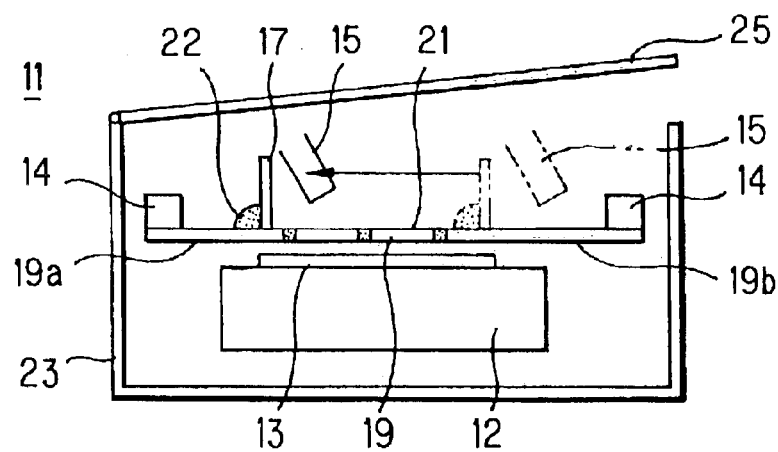

As shown FIGS. 2A, 2B, and FIGS. 3A and 3B, the material to be printed 13 is subjected to screen printing with the next coating step, degassing step, and printing step. As shown in FIG. 2A, the above-mentioned squeegee 15 and scraper 17 are transferred to an ink fountain 22 positioned at the second end 19b of the screen plate 19. As shown in FIG. 2B, off contact coating (coating without contact) is carried out by moving the scraper 17 from the second end 19b of the screen plate 19 to the first end 19a under atmospheric pressure.

Figure 3A:
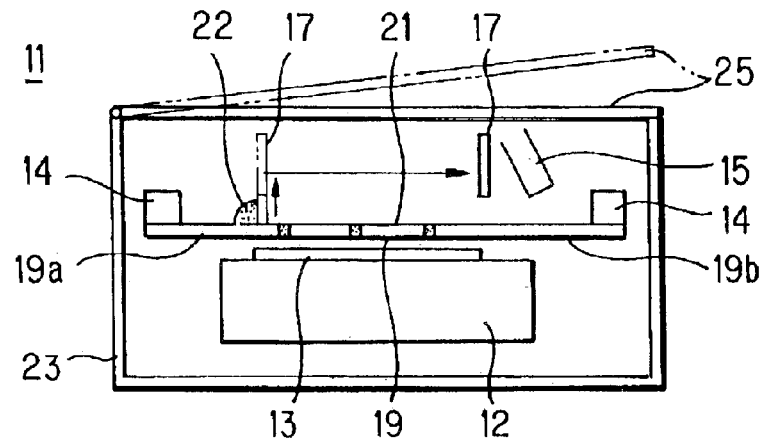
Figure 3B:
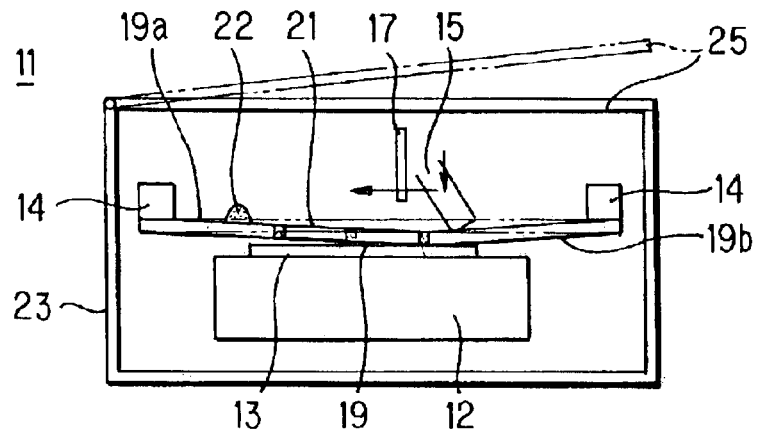

Then, as shown in FIG. 3A, the above-mentioned squeegee 15 and scraper 17 are moved from the first end 19a of the screen plate 19 to the second end 19b, and as mentioned above, the degassing step in which bubbles in the ink 21 which is the coating material is degassed by changing the pressure to a highly vacuum state, and to atmospheric pressure or a lower vacuum pressure is carried out. Then, as shown in FIG. 3B, under high-vacuum conditions, the ink 21 of the screen plate 19 is pressed to the material to be printed 13 by the above- mentioned squeegee 15 to carry out printing.

Figure 4A:
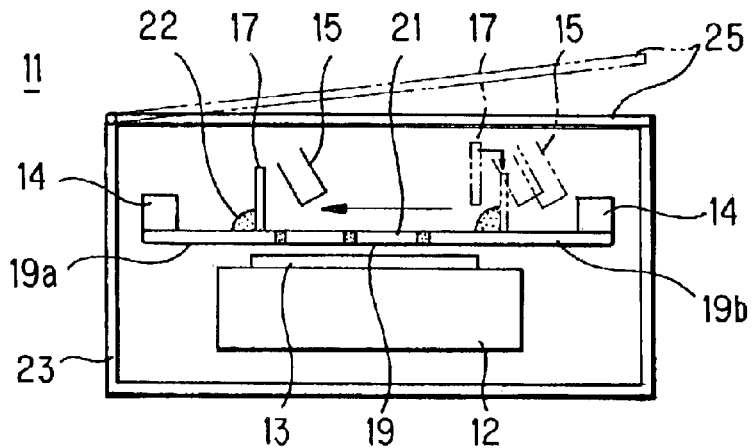

In FIGS. 4A, 4B, 4C and FIG. 5, a double-coating vacuum degassing printing method is shown. After subjecting the material to be coated to the coating step which is the first ink coating step and the degassing step according to the above-mentioned FIGS. 1(a) and 1(b), as shown in FIG. 4(a), the second ink coating step is carried out. That is, the coating step is carried out a plural number of times. Incidentally, a plural number of the coating step and a plural number of the degassing step are combined with each other, for example, a plural number of the coating steps and the degassing steps are repeated.

Figure 5:
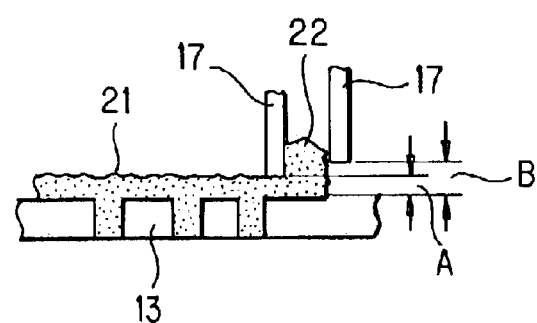
FIG. 5 is a partially enlarged front view showing that the screen printing method according to the present invention is applied to a screen printing method of double coating.

As shown in FIG. 5, a height of the scraper 17 at the time of the second ink coating is set higher than a height of the scraper 17 at the time of the first ink coating (which is the prior coating). That is, the height of the scraper 17 at the first ink coating is A, and the height of the scraper 17 at the second ink coating is B, and B is larger than A as shown. According to this constitution, an amount of the ink 21 at the printing can be made larger so that a decrease in bulk at the time of degassing can be supplemented. Incidentally, in this embodiment, although the height of the scraper 17 at the time of ink coating is made a different height, it may be the same height. When the height is made the same, it has an effect of correcting unevenness in the printing plane.

Figure 4B:
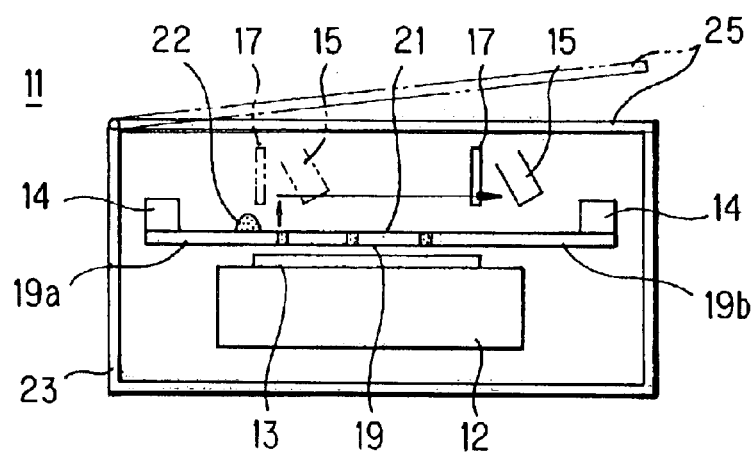
Figure 4C:
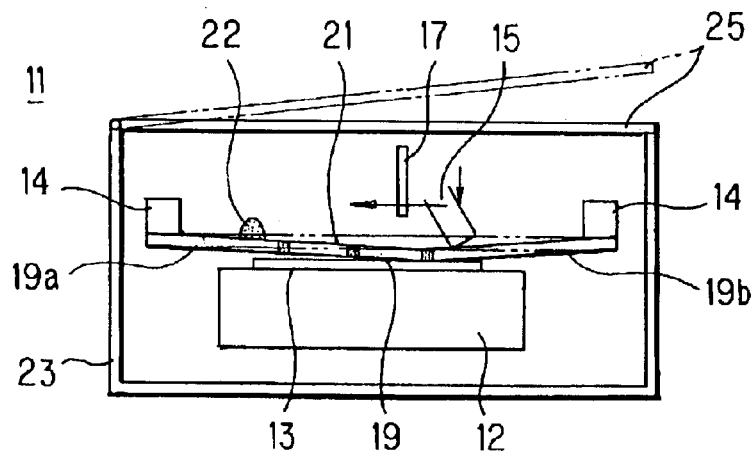

After completion of the coating step comprising the above- mentioned first ink-coating and the second ink-coating, as shown in FIG. 4B, the squeegee 15 and the scraper 17 are transferred from the first end 19a of the screen plate 19, and the pressure was changed to a high-vacuum state and atmospheric pressure or a low-vacuum state to carry out the degassing step of degassing bubbles in the ink 21 which is a coating material. Then, as shown in FIG. 4C, the printing step is carried out under the high-vacuum state by pressing the ink 21 of the screen plate 19 by the above-mentioned squeegee 15 to the material to be printed 13.

As explained above, according to the screen printing method of the first embodiment of the present invention, the method comprises a coating step of covering the paste-state or ink-state coating material on the surface of the screen plate for printing with a thin thickness, and a printing step in which the paste-state or ink-state coating material coated on the surface of the screen plate for printing is printed on a material to be printed by the above-mentioned squeegee under vacuum or atmospheric pressure. After the above-mentioned coating step, a degassing step is provided to degas bubbles in the coated material by changing the pressure from a high-vacuum state to atmospheric pressure or a low-vacuum state, so that degassing can be carried out from the paste-state or ink-state coating material before printing, occurrence of unevenness on the surface of the printing surface due to the effect of bubbles split at the surface of the printed resin encapsulating portion can be minimized, an amount or a thickness of the paste-state or ink-state coating materials to be printed can be made uniform, and screen printing of high quality and high performance can be carried out.

Also, according to the screen printing method of the second embodiment of the present invention, a paste-state or ink-state coating material is coated on the surface of the screen plate for printing with a thin thickness, and the paste-state or ink-state coating material coated on the surface of the screen plate for printing (which is obtained from an ink fountain at a side of a first edge of the surface of the screen plate in the coating step) is printed by the above-mentioned squeegee in a vacuum or atmospheric pressure. Therefore, an amount or a thickness of the paste state or ink state coating materials to be printed can be made uniform, screen printing of high quality and high performance can be carried out, attachment of a coating material to an unintentional portion of the surface of a material to be printed by migrating the coating material from a pore portion of the stencil to the back surface side of the stencil can be prevented, and excessive printing material, or attachment of a coating material to a portion other than a desired portion of the material to be printed or causing oozing, can be prevented.

Also, according to the screen printing method of the third embodiment of the present invention, it comprises a coating step of covering a paste-state or ink-state coating material on the surface of the screen plate for printing with a thin thickness, and a printing step in which the paste-state or ink-state coating material coated on the surface of the screen plate for printing (obtained from an ink fountain at an end of the surface of the screen plate in the coating step) is printed by the above-mentioned squeegee in a vacuum or atmospheric pressure. After the above-mentioned coating step, a degassing step is performed to degas bubbles in the coated material by changing the pressure from a high-vacuum state to atmospheric pressure or a low-vacuum state, so that degassing can be carried out from the paste-state or ink-state coating material before printing, occurrence of unevenness on the surface of the printing surface due to the effect of bubbles split at the surface of the printed resin encapsulating portion can be minimized, an amount or a thickness of the paste-state or ink-state coating materials to be printed can be made uniform, screen printing of high quality and high performance can be carried out, attachment of a coating material to an unintentional portion of the surface of a material to be printed by migrating the coating material from a pore portion of the stencil to the back surface side of the stencil can be prevented, and an excessive printing material being printed to the material to be printed from a screen plate, or attachment of a coating material to a portion other than a desired portion of the material to be printed or causing oozing, can be prevented.

Also, according to the screen printing method of the fourth embodiment of the present invention, a paste-state or ink-state coating material is covered on the surface of the screen plate for printing with a thin thickness, and a printing step in which the paste-state or ink-state coating material coated on the surface of the screen plate for printing (obtained from an ink fountain at an end of the surface of the screen plate in the coating step) is printed by the above-mentioned squeegee in a vacuum or atmospheric pressure. After completion of the above-mentioned coating step and before the printing step, a degassing step is performed to degas bubbles in the coated material by changing the pressure from a high-vacuum state to atmospheric pressure or a low-vacuum state, and the printing step is carried out in vacuum atmosphere. Therefore, degassing can be carried out from the paste-state or ink-state coating material before printing, occurrence of unevenness on the surface of the printing surface due to the effect of bubbles split at the surface of the printed resin encapsulating portion can be minimized, an amount or a thickness of the paste-state or ink-state coating materials to be printed can be made uniform, screen printing of high quality and high performance can be carried out, attachment of a coating material to an unintentional portion of the surface of a material to be printed by migrating the coating material from a pore portion of the stencil to the back surface side of the stencil can be prevented, and an excessive printing material being printed to the material to be printed from a screen plate, or attachment of a coating material to a portion other than a desired portion of the material to be printed or causing oozing, can be prevented.

Also, according to the screen printing method of the fifth embodiment of the present invention, a paste-state or ink-state coating material is covered on the surface of a screen plate for printing with a thin thickness by a scraper with a plural number of times, and a height of the scraper at the latter coating is made the same or different than the height of the scraper at the former coating. Therefore, an amount of the paste-state or ink-state coating material at the time of printing can be increased or decreased, and a decrease in bulk at the time of degassing can be supplemented.

Also, according to the screen printing method of the sixth embodiment of the present invention, the above-mentioned screen plate for printing is a gauze-adhered plate or stencil, so that the present invention can be applied to any of the screen plates.

According to the present invention, a screen printing method which can degas a paste-state or ink-state coating material before printing, can prevent unevenness of the surface of a printed surface due to bubbles popped from the surface of a printed resin encapsulated portion, can carry out screen printing of a high quality for high performance electronic parts by making an amount or thickness of a paste-state or ink-state coating material to be printed uniform, can avoid attaching a coating material to an unintentional portion of the surface of a material to be printed, and can prevent printing an excessive printing material on the material to be printed from a screen plate, attaching a coating material to a portion other than a desired portion of the material to be printed or causing oozing.

What is claimed is:

1. A screen printing method comprising:
   placing a material to be printed at a predetermined portion of a printing table;
   feeding one of a paste-state coating material and an ink-state coating material to a surface of a screen plate;
   coating a thickness of the one of the paste-state coating material and the ink-state coating material onto the surface of the screen plate to form a coated material layer;
   degassing bubbles in the coated material layer by changing a pressure surrounding the coated material layer from a high-vacuum state to one of an atmospheric-pressure state and a low-vacuum state; and
   printing the coated material layer onto the material to be printed by sliding the surface of the screen plate and a surface of a squeegee relative to each other while the pressure surrounding the coated material layer is at one of a vacuum state or the atmospheric-pressure state.

2. The screen printing method of claim 1, wherein the screen plate is one of a gauze-adhered plate and a stencil.

3. The screen printing method of claim 1, wherein said coating comprises moving a scraper and the surface of the screen plate relative to each other while the pressure surrounding the coated material layer is at the atmospheric-pressure state.

4. The screen printing method of claim 3, wherein said coating comprises moving the scraper in a first direction relative to the screen plate, and said printing comprises moving the squeegee in a second direction relative to the screen plate, the second direction being opposite the first direction.

5. A screen printing method comprising:

placing a material to be printed at a predetermined portion of a printing table;

feeding one of a paste-state coating material and an ink-state coating material to a surface of a screen plate from an ink fountain located at an end of the surface of the screen plate;

coating a thickness of the one of the paste-state coating material and the ink-state coating material onto the surface of the screen plate to form a coated material layer;

degassing bubbles in the coated material layer by changing a pressure surrounding the coated material layer from a high-vacuum state to one of an atmospheric-pressure state and a low-vacuum state; and printing the coated material layer onto the material to be printed by sliding the surface of the screen plate and a surface of a squeegee relative to each other while the pressure surrounding the coated material layer is at one of a vacuum state or the atmospheric-pressure state.

6. The screen printing method of claim 5, wherein said coating is repeated a plurality of times by moving a scraper and the screen plate relative to each other a plurality of times.

7. The screen printing method of claim 6, wherein said degassing is performed after each of said coating repetitions.

8. The screen printing method of claim 5, wherein the screen plate is one of a gauze-adhered plate and a stencil.

9. The screen printing method of claim 5, wherein said coating comprises moving a scraper and the surface of the screen plate relative to each other while the pressure surrounding the coated material layer is at the atmospheric-pressure state.

10. The screen printing method of claim 9, wherein said coating comprises moving the scraper in a first direction relative to the screen plate, and said printing comprises moving the squeegee in a second direction relative to the screen plate, the second direction being opposite the first direction.

11. A screen printing method comprising:

placing a material to be printed at a predetermined portion of a printing table;

feeding one of a paste-state coating material and an ink-state coating material to a surface of a screen plate from an ink fountain located at an end of the surface of the screen plate;

coating a thickness of the one of the paste-state coating material and the ink-state coating material onto the surface of the screen plate to form a coated material layer;

degassing bubbles in the coated material layer by changing a pressure surrounding the coated material layer from a high-vacuum state to one of an atmospheric-pressure state and a low-vacuum state; and after said degassing of the coated material layer, printing the coated material layer onto the material to be printed by sliding the surface of the screen plate and a surface of a squeegee relative to each other while the pressure surrounding the coated material layer is at a vacuum state.

12. The screen printing method of claim 11, wherein said coating is repeated a plurality of times by moving a scraper and the screen plate relative to each other a plurality of times.

13. The screen printing method of claim 12, wherein said degassing is performed after each of said coating repetitions.

14. The screen printing method of claim 11, wherein the screen plate is one of a gauze-adhered plate and a stencil.

15. The screen printing method of claim 11, wherein said coating comprises moving a scraper and the surface of the screen plate relative to each other while the pressure surrounding the coated material layer is at the atmospheric-pressure state.

16. The screen printing method of claim 15, wherein said coating comprises moving the scraper in a first direction relative to the screen plate, and said printing comprises moving the squeegee in a second direction relative to the screen plate, the second direction being opposite the first direction.

* * * * *